United States Patent
Vesci et al.

(10) Patent No.: US 7,561,015 B2
(45) Date of Patent: Jul. 14, 2009

(54) MAGNET SECURED IN A TWO PART SHELL

(75) Inventors: Anthony Vesci, San Jose, CA (US);
Alan B. Liu, Mountain View, CA (US);
Donny Young, San Francisco, CA (US);
Joe F. Sommers, San Jose, CA (US);
Kevin Hughes, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1067 days.

(21) Appl. No.: 10/727,132

(22) Filed: Dec. 2, 2003

(65) Prior Publication Data

US 2005/0116392 A1 Jun. 2, 2005

(51) Int. Cl.
*H01F 7/02* (2006.01)
(52) U.S. Cl. .............. 335/302; 335/285; 335/294; 335/303; 206/818; 223/109 A; 224/183; 264/611; 310/156.28
(58) Field of Classification Search ................ 335/285, 335/294, 302–303; 206/818; 223/109 A; 224/183; 264/611; 310/156.28
See application file for complete search history.

(56) References Cited

U.S. PATENT DOCUMENTS

| | | | | |
|---|---|---|---|---|
| 2,507,559 A | * | 5/1950 | D'Andrea | 15/220.2 |
| 2,719,267 A | * | 9/1955 | Miles et al. | 324/151 A |
| 3,041,697 A | * | 7/1962 | Budreck | 24/303 |
| 4,779,314 A | * | 10/1988 | Aoki | 24/303 |
| 4,896,131 A | * | 1/1990 | Podlesny et al. | 335/302 |
| 4,994,777 A | * | 2/1991 | Leupold et al. | 335/302 |
| 5,188,555 A | * | 2/1993 | Zbegner | 446/133 |
| 5,295,494 A | | 3/1994 | Rodriguez | 128/845 |
| 5,367,278 A | | 11/1994 | Yoshikawa | 335/285 |
| 6,306,265 B1 | | 10/2001 | Fu et al. | 204/192.12 |
| 6,608,415 B2 | * | 8/2003 | Komura et al. | 310/90 |
| 6,657,337 B1 | * | 12/2003 | Delevallee | 310/89 |
| 2003/0030347 A1 | * | 2/2003 | Lee | 310/239 |
| 2003/0204924 A1 | * | 11/2003 | Grez et al. | 15/22.1 |

* cited by examiner

*Primary Examiner*—Elvin G Enad
*Assistant Examiner*—Mohamad A Musleh
(74) *Attorney, Agent, or Firm*—Law Offices of Charles Guenzer

(57) ABSTRACT

A magnet encapsulated within a canister formed from two cans into a laminated structure particularly useful in plasma processing reactors. Each can includes an end wall and a cylindrical sidewall. One can additionally includes an annular lip that slidably fits outside the sidewall of the other can with a small gap therebetween. The magnet is inserted into the two cans together with a flowable and curable adhesive such as epoxy. The cans are slid together and compressed to cause the adhesive to flow between the magnet and the two cans and between the lip of one can and the sidewall of the other. The adhesive is cured to bond the magnet to the cans and to bond the cans together and to also hermetically seal the structure. The cans may be deep drawn from non-magnetic stainless steel with wall thicknesses of less than 0.064 mm.

25 Claims, 5 Drawing Sheets

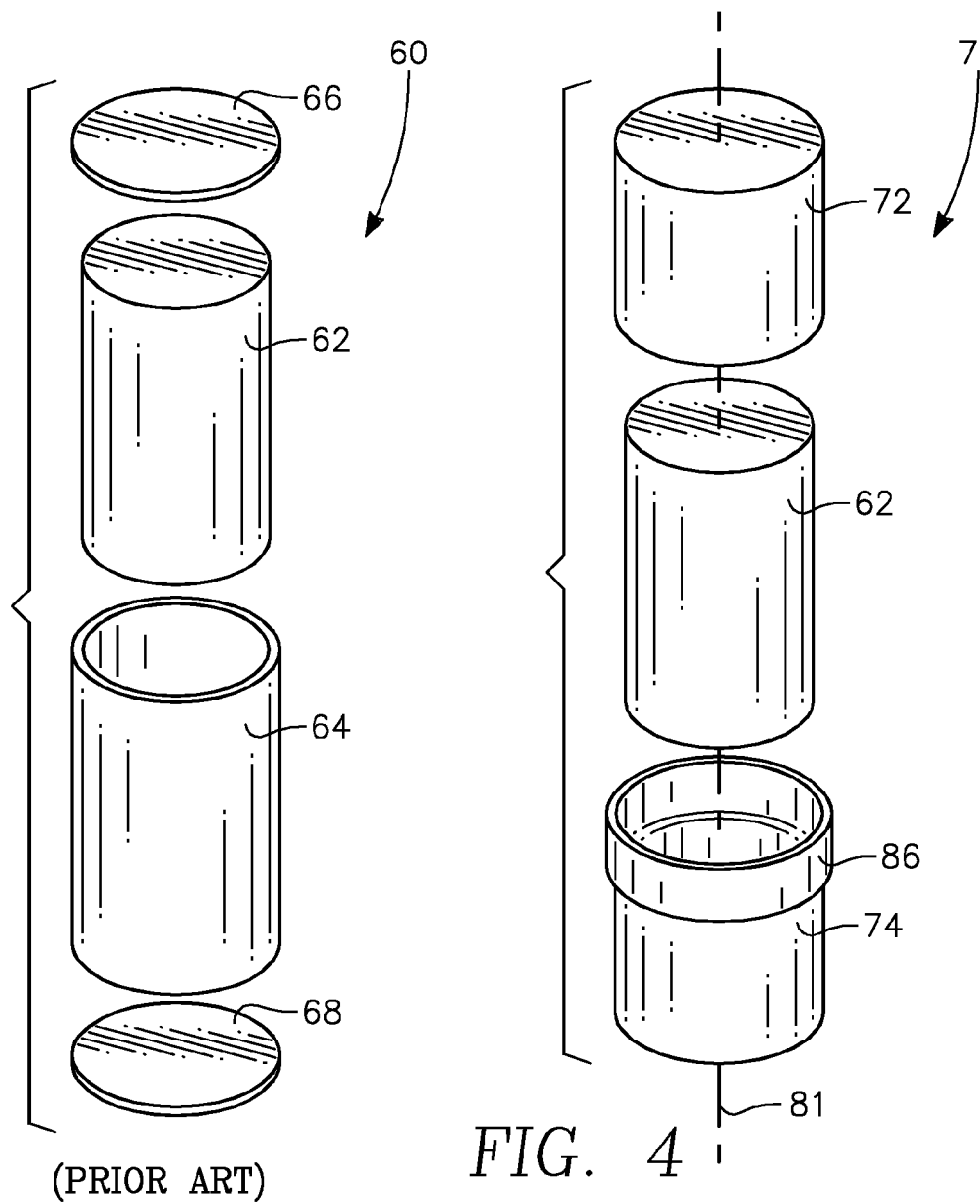
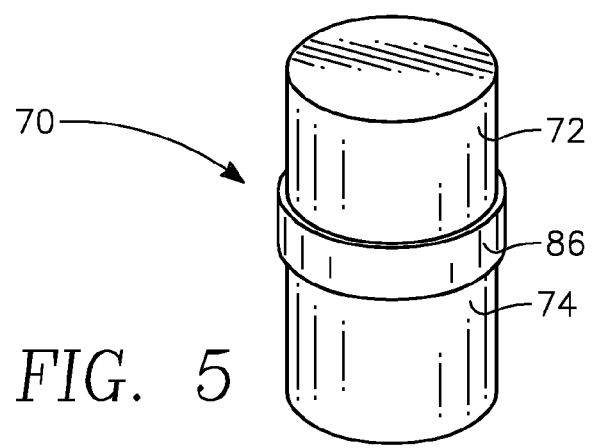
(PRIOR ART)
FIG. 3
FIG. 4
FIG. 5

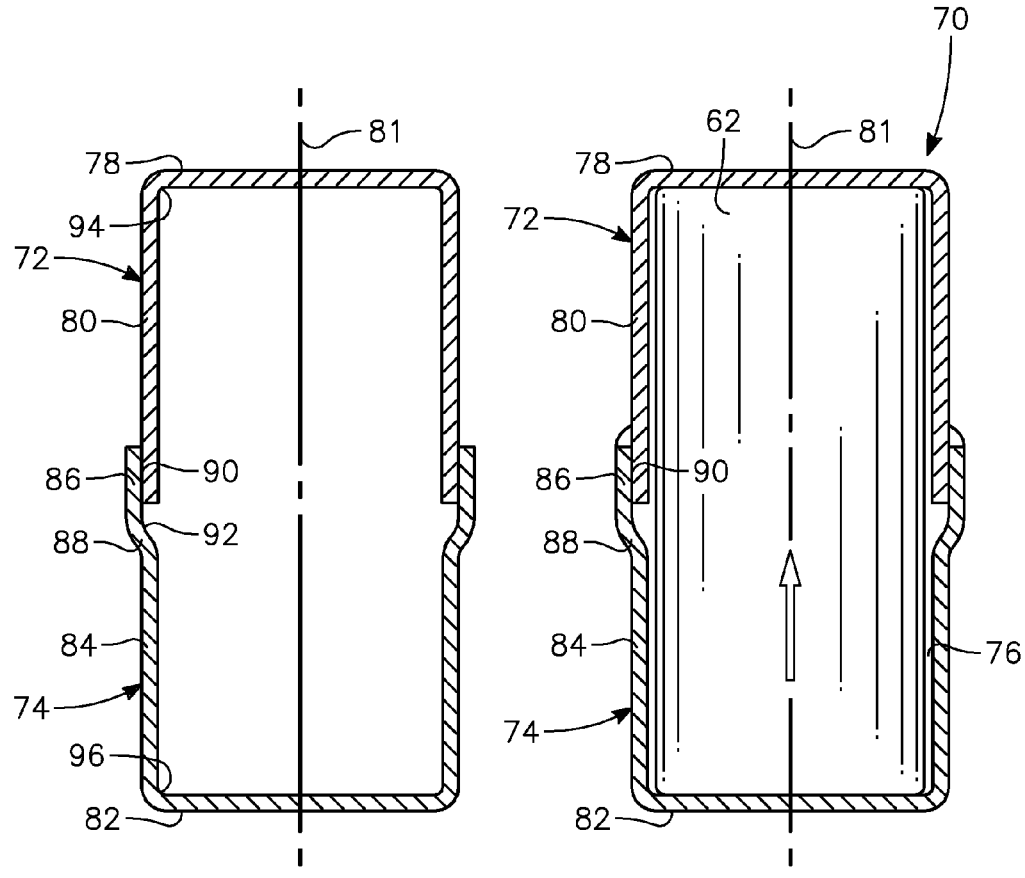
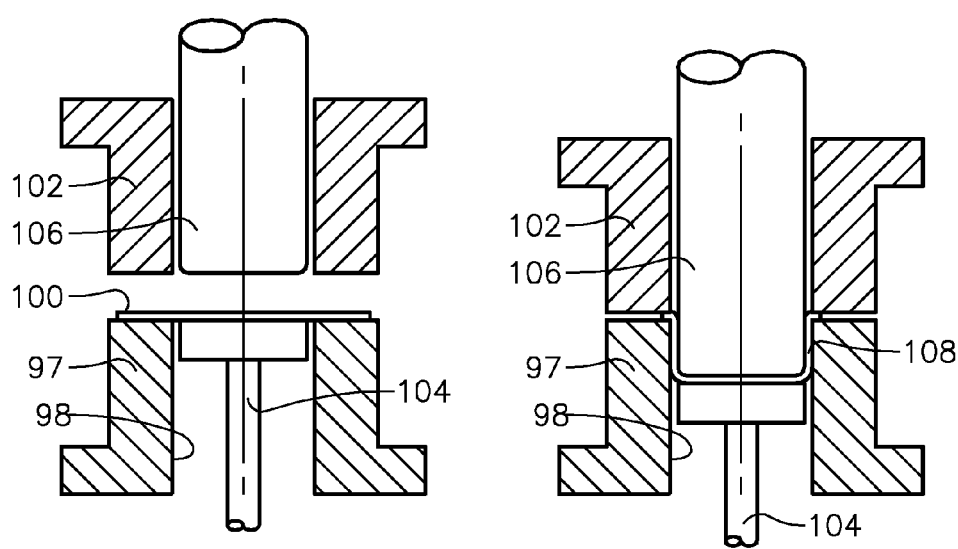

MAGNET SECURED IN A TWO PART SHELL

FIELD OF THE INVENTION

The invention relates generally to magnets. The invention relates in particular to the packaging and encapsulation of magnets and similar objects.

BACKGROUND ART

Permanent magnets are used in a number of applications in which the magnetic material needs to be protected from the environment in which the magnet is used. The protection is particularly needed for high-strength magnets formed of highly magnetic but oxidizable materials such as NdBFe. One application requiring a large number of magnets occurs in integrated circuit fabrication in plasma reactors in which magnets are used to control the plasma. For example, in U.S. Pat. No. 6,183,614, incorporated herein by reference in its entirety, Fu describes a magnetron sputter reactor producing a self-ionizing plasma. In a reactor 10 schematically illustrated in cross section in FIG. 1, a wafer 12 to be sputter coated with a metal is supported on a pedestal 14 within a vacuum chamber 16 in opposition to a target 18 composed of that metal. A vacuum system 20 pumps the vacuum chamber 16 to a pressure in the milliTorr range while an unillustrated gas source supplies argon as a working gas into the reactor interior. A DC power supply 22 negatively biases the target 18 to excite the argon into a plasma. The positive argon ions are attracted to the target 16 where they dislodge or sputter metal atoms, some of which strike the wafer 12 and form a metal layer thereon.

The sputtering is greatly enhanced by a magnetron 30 placed in back of the target 16. Its magnetic field inside the chamber traps electrons and thereby produces a high-density plasma region 32. A magnetron useful for producing a self-ionizing plasma includes an inner magnet assembly 34 of one vertical magnetic polarity surrounded by an annular outer magnet assembly 36 of substantially greater total magnetic intensity, that is, an unbalanced magnetron. A magnetic yoke 38 supports both magnet assemblies 34, 36 and magnetically couples them. The magnetron 30 is relatively small compared to the target 18 but is rotated about a central chamber axis 40 by a rotary drive shaft 42 supporting the yoke 38 to thereby provide more uniform sputtering of the target 18.

In one embodiment, both magnet assemblies 34, 36 are composed of a plurality of cylindrical magnets illustrated in the vertical view of FIG. 2. The inner magnet assembly 34 includes several cylindrical magnets 44 arranged in a triangular array. The outer magnet assembly 36 includes even more cylindrical magnets 46 arranged in a generally triangular ring with its apex near the target center and the center of rotation and a rounded base side near the target periphery. Unillustrated respective pole pieces cover the two sets of magnets 44, 46 to present a uniform pole and to sandwich the magnets 44, 46 against the back yoke 38. Conveniently both types of cylindrical magnets 44, 46 may have the same size and construction with the polarities determined by their orientation of the magnets 44, 46 within their respective assemblies 34, 36. However, to fine tune the magnetic fields, some of the magnets 46 in the outer assembly 36 may be differently sized. To maximize the magnetic fields, the rod magnets are typically composed of a highly magnetic material such as NdFeB.

Fu has disclosed the reactor 10 described to this point in U.S. Pat. No. 6,183,614, incorporated herein by reference in its entirety. Other roof magnetrons are known, typically balanced magnetrons having paired complementary magnets arranged in a large closed path. Other sputter reactors may utilize other types of magnet arrays. In one advanced reactor, an inductive coil 48 is composed of the same material as the target 18 and is sputtered together with it. To increase the plasma density near the coil 48 as well as to guide sputtered ions towards the wafer 12, an annular magnet assembly 50 is positioned outside the sidewalls of the chamber 16. The annular magnet assembly 50 is typically composed of a large number of rod magnets arranged in a circle. The principal means used in the art for exciting a gas into a plasma within a processing chamber include DC or RF biasing of the target 18, counter-electrode, or the pedestal 14, inductively coupling RF power into the chamber through coils located at various locations, or remotely exciting a gas flow into a plasma with microwaves.

The roof magnetron 30 is usually immersed in a water bath 52 contained within a tank 54 on the back side of the target 18. The water or other cooling fluid is continuously recirculated through an unillustrated chiller to cool the target 18 whose front face is exposed to the heated plasma and is being irradiated by energetic argon ions.

The rod magnets are typically provided with some sort of passivation or encapsulation. Often the magnets are plated with nickel, but the plating is subject to scraping and degradation of its protective effect. Better protection is provided if the magnet is instead encapsulated in a hermetically sealed canister. That is, the canister prevents the significant passage of gas or liquid from the exterior in an amount sufficient to affect the encapsulated magnet. The encapsulation is particularly needed to protect the fragile NdFeB material within the water bath 52, but it is standard practice to provide some kind of protection for the NdFeB even in a more benign environment. As illustrated in the exploded view of FIG. 3, a conventional encapsulated magnet 60 includes a cylindrical magnet 62, for example, of NdFeB. An exemplary magnet used in sputter reactors has a length of 1¼" (32 mm) and a diameter of ⅝" (16 mm), but the magnet size is freely chosen according to the application. A tubular sleeve 64 is machined from stainless steel tube or rod to close tolerances matching the diameter and length of the rod magnet 62. Similarly, two end caps 66, 68 are machined from stainless steel plate to match the diameter of the sleeve 64. The sleeve 64 may be formed from non-magnetic stainless steel such as Series 300 stainless while the end caps 66, 68 are preferably formed of a magnetically soft stainless steel such as Series 400 stainless so as to act as pole faces. In the encapsulation process, the bottom end cap 68 is laser welded to the one end of the sleeve 64. The rod magnet 62 is then placed inside the sleeve 64 and the top end cap 66 is laser welded to the other end of the sleeve 64 adjacent the rod magnet 62 in place inside the sleeve 64. It is typical also to machine the welded assembly by turning and grinding to achieve the required dimensions.

Although such a welded assembly provides very satisfactory protection of the magnets from the environment, the conventional magnet encapsulation technique suffers from several drawbacks. The welding and machining required before and after welding is labor intensive and hence expensive. Particularly the laser welding is difficult to closely control and is subject to significant process variations. A very large number of rod magnets in the large magnet arrays such as the roof magnetron 30 and the sidewall auxiliary magnet assembly 50 of FIG. 2. The expense of encapsulation has dominated the cost of these magnetic systems and significantly impacts the total cost of the sputter reactor.

Furthermore, laser welding requires a substantial body to be welded. As a result, the end caps 66, 68 have conventionally had a thickness of about 0.001" (2 mm). To more effectively project the magnet field from the ends of the magnet 62, the end caps 66, 68 are typically made of ferromagnetic stainless steel to act as pole pieces. On the other hand, the sleeve 64 must be made of non-magnetic material to prevent magnetic shorting of the magnet 62. The weld between two different materials, even if both are stainless steel, is a source of corrosion.

Laser welding is necessarily a high-temperature process even if the weld does not extend to the magnet. NdFeB has a relatively low Curie temperature. Any portion of the magnet 62 which is raised above the Curie temperature irreversibly loses its ability to be magnetized. Even raising the magnetic material to a few hundred degrees can reduce the magnetization and require repoling of the magnet. The post-machining with the magnet already encapsulated also introduces the possibility of mechanical and thermal damage to the magnet. In any case, the machining is most conveniently performed with the enclosed magnet 62 left in its unmagnetized state. Only after completion of encapsulation is the magnet 62 poled.

Furthermore, an air gap invariably remains between the magnet and the welded case. As a result, the magnet can move within the case. High-strength magnets are strongly attracted to each other and may collide at high speed, causing the encapsulated magnets to bang against the interior of the canister. Such shock may damage the fragile magnetic material and impact its magnetic properties with no visible evidence of the damage appearing to the operator. Furthermore, the NdFeB is subject to shock damage if the encapsulated magnet is dropped or hit, but the heavy stainless steel case tends to not show any external evidence of any untoward effect that might merit replacement or further inspection.

Enough variability exists in the fabrication process arising from the above effects that magnets have been observed to be subject to significant and unpredictable variability. A common practice has been to assemble the magnets into a higher-level assembly and map the magnetic field from the assembly. If the distribution of the mapped field is inadequate, the array is disassembled. Some magnets may be discarded or at a minimum rearranged in the array before the array is reassembled. Failures have been observed in the past at a sufficiently high rate that it is customary to map every assembly. Even ignoring the cost of damaged magnets, the mapping and occasional disassembly introduce a significant cost.

SUMMARY OF THE INVENTION

An encapsulated assembly supports and hermetically seals a supported member, particularly a magnet, within a thin-wall shell formed of at least two shell members that slide together. A flowable and curable adhesive is inserted with the supported member inside the shell members. The shell members may be pressed together to squeeze the adhesive between the sides of the supported member and the shell and between overlapping portions of the shell members, thereby sealing the shell and rigidly supporting the supported member in a laminated structure formed on the magnetic substrate. The compression process may rely upon the mutual attraction along a common axis of two magnetic assemblies. After compression, the adhesive is cured preferably at room temperature. The curable and flowable adhesive may be a two-part epoxy adhesive that cures at room temperature.

Flow and bonding of the adhesive are promoted if the gap between the magnet and inner sidewall is less than 0.25 mm, preferably less than 0.05 mm but greater than 0.025 mm, and the clearance between the two shell sidewalls is less than 0.2 mm, preferably less than 0.1 mm, but preferably greater than 0.013 mm.

The shell members are preferably deep drawn in a stamping process. For a magnet canister, the shell members should be stamped from a non-magnetic material, such as a non-ferromagnetic stainless steel. Their wall thicknesses may be less than 0.64 mm and preferably less than 0.38 mm but more than 0.05 mm.

One shell member may be formed as a first can with a cylindrical sidewall and an end. The other shell member may formed as a second can with a similar cylindrical sidewall and end and additional including a cylindrical lip extending axially away from the sidewall. The lip is slid on the outside of the sidewall of the first can with a small clearance therebetween to allow the adhesive to flow through it and bond the two shell members together.

Preferably the two can have nearly equal axial length. However, other structures provide many of the advantages of the invention. One embodiment includes a long tubular can and a short tubular cap fitting over the end of the long can. Another embodiment includes a sleeve with two short caps fit over the axial ends of the sleeve and sealed thereto.

Magnets and canisters of geometries other than right circular cylinders benefit from the invention. For example, a toroidal magnet can be encapsulated in a two-part shell having two annular moat-shaped cans, one of which has a first annular lip connected to the inside wall and displaced radially inwardly and a second annular lip connected to the outside wall and displaced radially outwardly such that the two lips slide over the other can with the magnet enclosed between the cans. The structure leaves a central bore coaxial with the magnet.

The encapsulation method may be performed on magnets in the magnetized or unmagnetized state and on other types of members to be encapsulated.

BRIEF DESCRIPTION OF THE DRAWINGS

FIG. 3 is an exploded isometric view of the parts of a conventional encapsulated magnet.

FIG. 4 is an exploded orthographic view showing the two cans of an encapsulating shell and a magnet to be sealed in the shell.

FIG. 5 is an orthographic view showing the assembled encapsulated magnet.

FIG. 6 is a cross-sectional view of the two cans assembled to form a shell but without a magnet within the shell.

FIG. 7 is a cross-sectional view of the two cans assembled with a magnet and adhesive to form an encapsulated magnet.

FIGS. 8 and 9 are schematic cross-sectional views of a stamping apparatus which may be used to deep draw the cans.

DETAILED DESCRIPTION OF THE PREFERRED EMBODIMENTS

Figure 1:
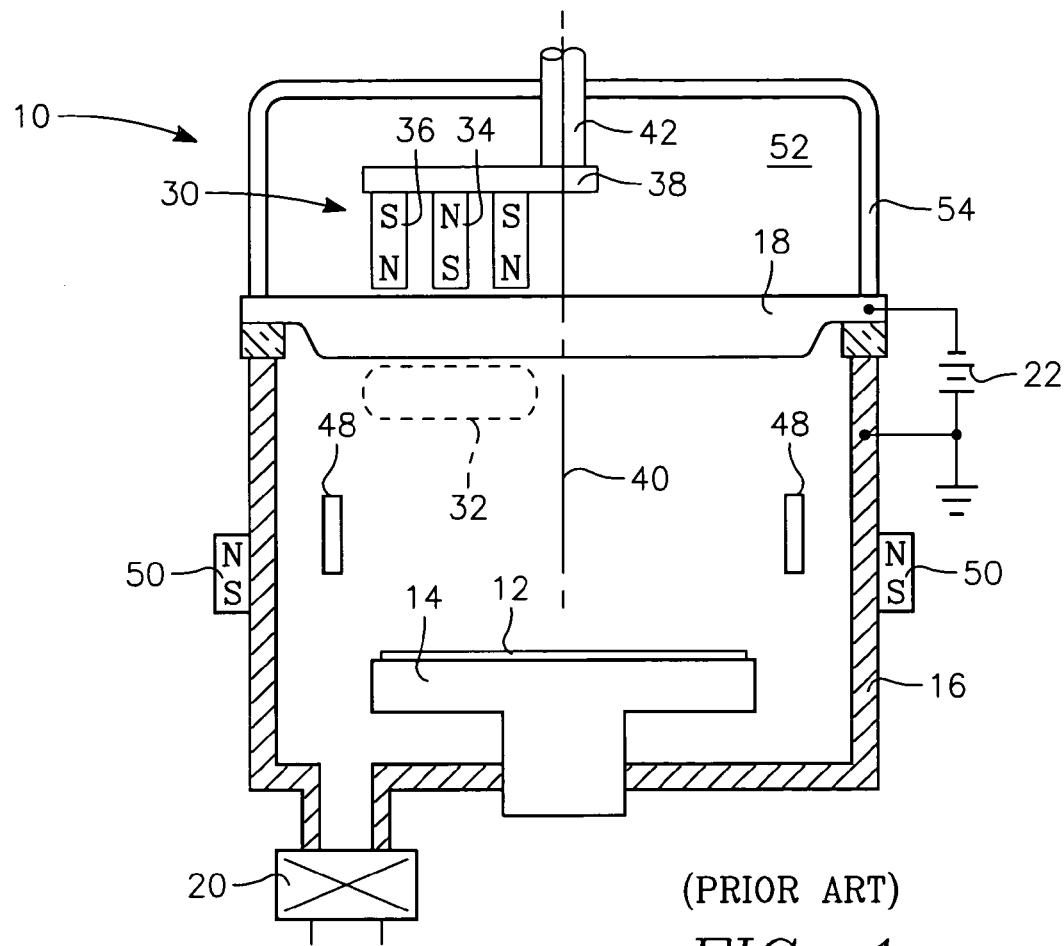
FIG. 1 is a schematic cross-sectional view of a prior art sputter reactor including a roof magnetron and a sidewall magnet assembly.
Figure 2:
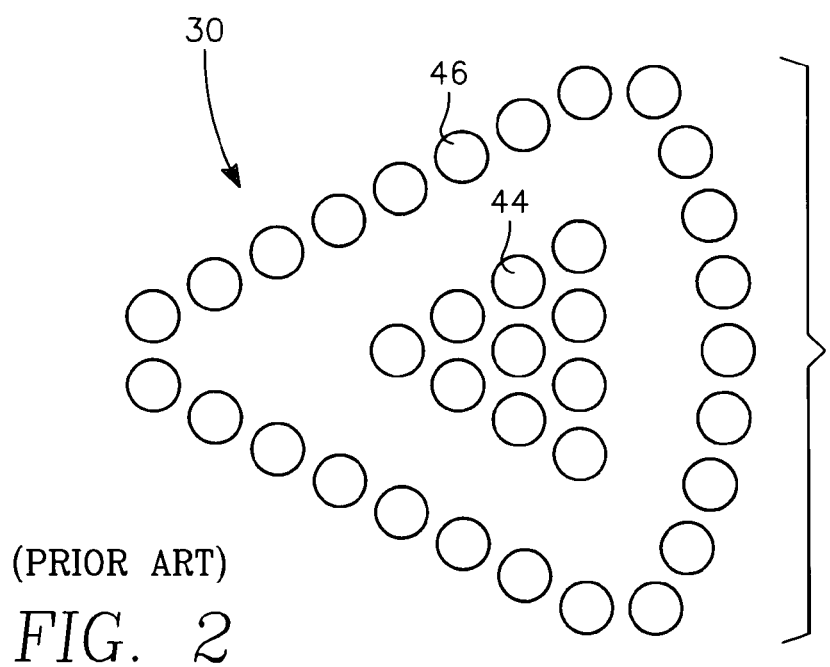
FIG. 2 is plan view of the array of magnets conventionally used in the roof magnetron of FIG. 1.

One embodiment of the invention is an encapsulated magnet 70 illustrated in exploded isometric view in FIG. 4. The magnet 62 is encapsulated within a thin shell composed of a top, male can 72 and a bottom, female can 74 that may be slid together with the magnet 62 is enclosed and then sealed. It is understood that the orientation of the cans is not generally material and the terms "top" and "bottom" are used only for convenience in describing the drawings. As will be discussed in more detail later, the cans 72, 74 are preferably formed of non-magnetic stainless steel and have a small and substantially constant wall thickness, at least over their respective principal surfaces. The joined cans 72, 74 are illustrated in cross-section in FIG. 6 without the magnet and in FIG. 7 with the enclosed magnet 62 and an adhesive 76. The thickness of the adhesive 76 is exaggerated in FIG. 7. It preferably forms a minimum thickness film over a major portion of the sidewall interface between the magnet 62 and the cans 72, 74 and may remain in at least portions of the interfaces between the ends of the magnet 62 and the cans 72, 74.

The top can 72 is formed of a single, continuous, fluid-impermeable member having a disk-shaped end 78 and a tubular sidewall 80 both substantially circularly symmetric about a central axis 81. The inside diameter of the sidewall 80 is slightly larger than the diameter of the magnet 62 to slidably accommodate the magnet 62 and to allow the flow of uncured adhesive in the gap between the sidewall 80 and the magnet 62. The clearance between the sidewall 80 and the magnet is preferably less than 0.010" (0.25 mm) and is conveniently designed at 0.002" (0.05 mm) with fabrication variations preferably resulting in a gap of at least 0.001" (0.025 mm).

The bottom can 74 has a similar disk-shaped end 82 and tubular sidewall 84 with substantially the same diameters differing by preferably no more than 0.0005" (0.013 mm) primarily limited by the precision of fabrication. However, the bottom can 74 additionally includes a tubular lip 86 extending axially away from the sidewall 84 through a sloping portion 88 and having an inner diameter somewhat larger than the outer diameter of the two sidewalls 80, 84 to allow the two cans 72, 74 to slide together in an overlapping portion forming an annular joint 88 between the two overlapping can 72, 74. The clearance between the outer diameter of the top can 80 and the inner diameter of the lip 86 is preferably less than 0.008" (0.2 mm), more preferably less than 0.004" (0.1 mm), and is conveniently designed at 0.002" (0.05 mm). A design clearance should be maintained above 0.0005" (0.013 mm) to ease fabrication and promote adhesive flow. The resulting structure resembles a lip stick case or metal cigar tube. The finite width of the joint 88 also allows uncured adhesive to flow through it and so form a sealant within the joint 88, thus providing a hermetically sealed structure. The asymmetric forms of the two cans 72, 74 allows the polarity of the encapsulated magnet 62 to be visually apparent after assembly if the polarity identification is maintained during assembly or poling.

The axial lengths of the two cans 72, 74 are chosen such that, when the magnet 62, as illustrated in FIG. 7, is captured between the two ends 78, 82, a small annular recess 92 is formed adjacent the overlapping portions of the can sidewalls 72, 74. That is, the total length of the assembled encapsulated magnet 70 is determined by the length of the magnet 62 and not by the structure of the cans 72, 74. The extra slip producing most of the annular recess 92 may advantageously be in the range of 0.030 to 0.040" (0.75 to 1 mm). Tooling cost in forming the cans 72, 74 by stamping may be reduced if the axial lengths of the two cans 72, 74 are the same so that inserts may be selectively used in conjunction with a base stamp and die. Corners 94, 96 of the two cans 72, 74 may be rounded if their radii are equal to or less than the corner radius specified for the magnet 62, thereby preventing the magnet 62 from resting on the cans' rounded corners 94, 96.

The two cans 72, 74 may be conveniently and economically formed as continuous, integral, and hermetic members by deep drawing, a form of stamping used to form beverage containers and the like at very low cost. This well known room-temperature process is schematically illustrated in the cross-sectional view of FIGS. 8 and 9. A die 97 is formed with a hole 98 having a diameter generally corresponding to that of the stamped can. A blank 100 of the can material is placed above the hole 98, and a knockout 104 is raised to the back of the blank 100. A blankholder 102 is configured to hold the blank against the die 97 and to allow a stamp 106 to pass through an aperture. The stamp 106 is shaped approximately as the interior of the intended can including rounded corners. In the drawing process, both the blankholder 102 and stamp 106 are hydraulically or mechanically lowered. The blankholder 102 stops on the blank 100 and exerts enough pressure on it to allow it to follow the drawn material into the hole 98. The stamp 106 continues downwardly against the less biased knockout 104 to cold draw the blank 100 into a drawn can 108 illustrated in FIG. 9. Thereafter, the stamp 106 and blankholder 102 are raised, and the knockout 104 is raised to eject the drawn can 108. The top of the drawn can 108 is trimmed. Although both the die 97 and the stamp 106 are cylindrically shaped, two effects may cause the drawn cans to be slightly tapered. The stamping both plastically and elastically deforms the blank so that the structure snaps back after the stamp is removed to recover the elastic strain. Also, during deep drawing, the top of the partially drawn may pull away from the stamp 106 and the bottom may pull away from the die 97.

The dual-diameter sidewall of the bottom can 74 can be produced by a more complex die and stamp pattern. Other forms of stamping a blank into a die are known and may be practiced with the invention dependent upon the required geometries.

For magnet encapsulation, the blank material is preferably a Series 300 stainless steel, which is non-ferromagnetic. After stamping and trimming, the cans should be passivated in an acid etch to remove any ferromagnetic material introduced by the stamping and trimming as well as any other contaminants.

As mentioned previously, the conventional caps and sleeves have wall thickness of about 0.100" (2.5 mm). In contrast, the wall thicknesses for the stamped cans can be reduced to below 0.025" (0.64 mm) and more preferably below 0.015" (0.38 mm). A convenient thickness for stamping is 0.010" (0.25 mm). The reduced thickness is particularly advantageous for the can ends so that the outside of the encapsulated magnet is very close to the end of the magnet. However, a rigid structure and ease of fabrication are promoted if the wall thickness is kept above a minimum of, for example, 0.002" (0.05 mm). Because of the thinness of the can ends, a ferromagnetic material forming a pole piece at the axial ends of the magnet encapsulating structure is not required. The stamping process can be controlled to produce different wall thicknesses for the end and the sidewalls. However, a constant wall thickness of 0.010" has been found to be very effective.

The preferred assembly process will now be described in more detail. The magnet 62 may be poled prior to assembly but poling of the magnetizable member may be delayed until after assembly. A drop of a flowable and curable adhesive is applied to one end of the magnet 62, which end is then pressed vertically downward into the male can 136. The drop of adhesive is large enough that the uncured adhesive flows along the side of the magnet 62 and exudes over the rim of the can 136, thereby expelling all the air from the male can 136. The partial assembly is inverted and another drop of the adhesive is applied to the other end of the magnet 62. The male can 136 with attached magnet 62 is slid into the female can 144 to overlap in the region of the lip 86 and with sufficient force to flow the adhesive. The size of the second drop is sufficient that the adhesive flows through and fills the remainder of the gap between the magnet 62 and the can sidewall 146 including the annular recess 92 to form the adhesive body 76, which as yet is uncured and of sufficiently low viscosity to flow. The adhesive further flows through the joint 90 between the overlapping portions of the cans 72, 74 and forms a visible bead 92 on the exterior of joint 90. The process removes substantially all air from the interior of the cans 136, 144. The gaps between the magnet and the can sidewalls and between the overlapping sidewalls at the joint are optimized in view of the viscosity of the flowable adhesive. The two cans 72, 74 are further axially compressed or forced together to cause the magnet ends to closely abut the can ends 78, 82. If the magnet ends and the can ends are all substantially flat, the compression removes most if not all of the adhesive from the interface between the ends of the magnet 62 and the can ends 78, 82 and to force the adhesive to further flow as described above. If the compression continues during the curing, small non-planarities in the can ends 78, 82 can be reduced as the flattened ends 78, 82 are bonded to the flat can ends 78, 82.

A convenient pressing or compression procedure uses the already poled magnets themselves for the compressive force. A number of such assembled but uncured magnets 70 assembled are placed in a row with parallel magnetic polarities while the adhesive remains left. NdFeB magnets when placed end to end can exert a considerable attractive force sufficient for the desired compression. After pressing, the exposed bead of adhesive should be cleaned from the joint 90 and the adhesive is cured into a unflowable material bonding to the surfaces it contacts, thereby mechanically fixing the parts into a one-piece laminated structure using the magnet 62 as a substrate. There is no space available for the magnet 62 to move within the bonded cans 136, 144. The magnets may be left in the compressing row during the curing process.

A two-part epoxy adhesive has been found effective in forming a tight hermetically sealed structure. Epoxy adhesives are widely known and commercially available. In the absence of a catalyst, the epoxy organic precursor is based on a triangular bonding structure of $C_2O$, which polymerizes in the presence of the added catalyst. Such epoxies include TorrSeal available from Varian and HiSol-H1C, available from Loctite. These epoxies have reasonably low viscosity so that they flow during a short period following addition of the catalyst. They may be cleaned with alcohol, Windex, or acetone. They harden at room temperature in about an hour and completely cure in 24 hours. For use in sputter reactor water bath, the adhesive must be resistant to water at reasonably high temperatures. The listed epoxies satisfy these requirements.

Several encapsulated magnets were prepared according to the described method. They were then treated for two weeks in an autoclave with a water ambient at 120° C., that is, under pressure. After autoclaving, no damage was visible on the magnet package. The assemblies were sectioned and inspected. The epoxy adhesive continued to bond the structure together in a tight lamination with no apparent damage.

Other epoxies and other types of adhesives may used if they have reasonably low viscosity and cure at low temperatures, preferably room temperature although but elevated curing temperatures of less than 100° C. are considered acceptable. Especially when the magnets are used in a cooling bath, the cured adhesive should be water-resistant, preferably non-hygroscopic.

The thin walls of the deep drawn cans provide less mechanical protection than the thicker walls of the machined sleeves and caps of the prior art of FIG. 3. However, the cured adhesive is somewhat resilient and provides some shock resistance. Further, any significant mechanical shock is likely to leave a mark on the thin shell. While the magnet may be damaged, the shock mark provides a visible indicator that the magnetic properties of the encapsulated magnet should be questioned.

The adhesive 76 not only hermetically seals the encapsulating shell, thus thereby protecting the enclosed magnet 62 by preventing the passage of gas or fluid though the shell, the adhesive 76 also expels substantially all included air and binds the magnet 62 to the shell in a strong laminated structure. The structure is mechanical similar to a plated passivation but with a somewhat resilient cured adhesive. Thereby, the magnet 62 cannot shake within the shell and result in undetected mechanical damage.

Applying and curing the adhesive is a much simpler and more reproducible operation than the conventional laser welding. The use of a room-temperature adhesive eliminates the high-temperature processing of laser sealing the canister closely adjacent to the magnet. Also, post-machining is not required. As a result, the inventive canister and adhesive utilize much more benign and less labor-intensive processing than that required in the prior art. The benign and straightforward processing eliminates most of the sources of variability introduced in the assembly of magnet canisters. As a result, the need for magnetic mapping each assembly is greatly reduced. Instead, the magnetic mapping may be consigned to an audit role in which only occasional assemblies are mapped in order to detect any drift in the fabrication process.

Although the described encapsulated magnet benefits from hermetical sealing when used in a harsh environment, the canister of the invention provides other benefits in a less hostile environment. For example, magnets should be mechanically fixed within the apparatus. With the invention, the mechanical fixing means such as clamps, collars, or straps contact the shell and not the fragile magnet or the thin passivating film such as nickel coated on the magnet. Direct contact with the magnet can mechanically damage it, and contact to the thin coated passivating nickel coating can pierce and degrade the passivation. The invention provides a rigid laminated structure in which the magnet is bonded within the protective canister.

The invention is not limited to the described combination of cans. A first variant, illustrated in the cross-sectional view of FIG. 10 includes a deep can 112 and a shallow cap 114, each of which has a single cylindrical sidewall with the sidewall of the deep can 112 snugly fitting within the sidewall of the shallow cap 114. This configuration has a simpler geometry than that of FIG. 6, but it suffers some disadvantages. Deep drawing becomes progressively more difficult with increased length. Further, the taper generally resulting from deep drawing now extends over the increased length of the deep can 112 and over most of the length of the magnet. Therefore, significantly different gaps for the adhesive occur at the two ends of the magnet. Yet further, the exit path for squeezed adhesive is much longer along the deep can 112 than along the shallow cap 114, which complicates the uniform filling and sealing of the sides of the magnet.

Figures 10, 11:
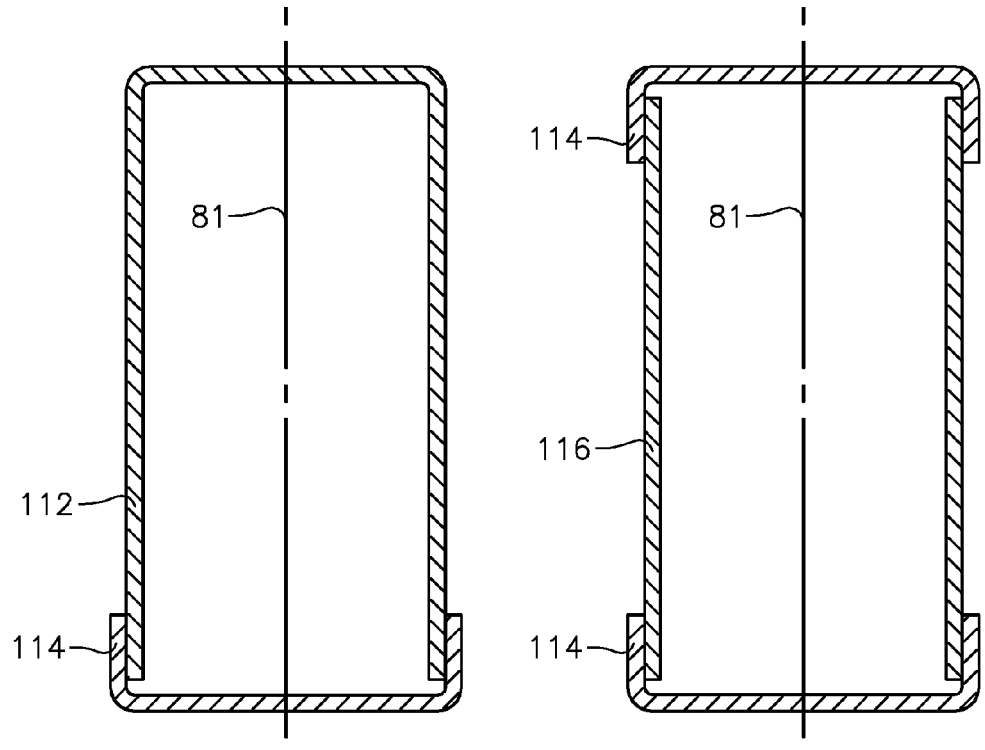
FIGS. 10 and 11 are cross-sectional views of two other embodiments of a multi-part encapsulating shell of the invention.

A second variant, illustrated in the cross-sectional view of FIG. 11 includes a tubular sleeve 116 enclosed by two shallow caps 114 sealing its two ends. This variant has the further disadvantage that adhesive applied to the two ends of the magnet received little force to flow along the inner surface of the sleeve 116, thus leaving an air gap along the major portion of the magnet. Nonetheless, the magnet is firmly anchored at its two ends. In this embodiment, the sleeve 116 may advantageously be formed by means other than deep drawing.

Figure 12:
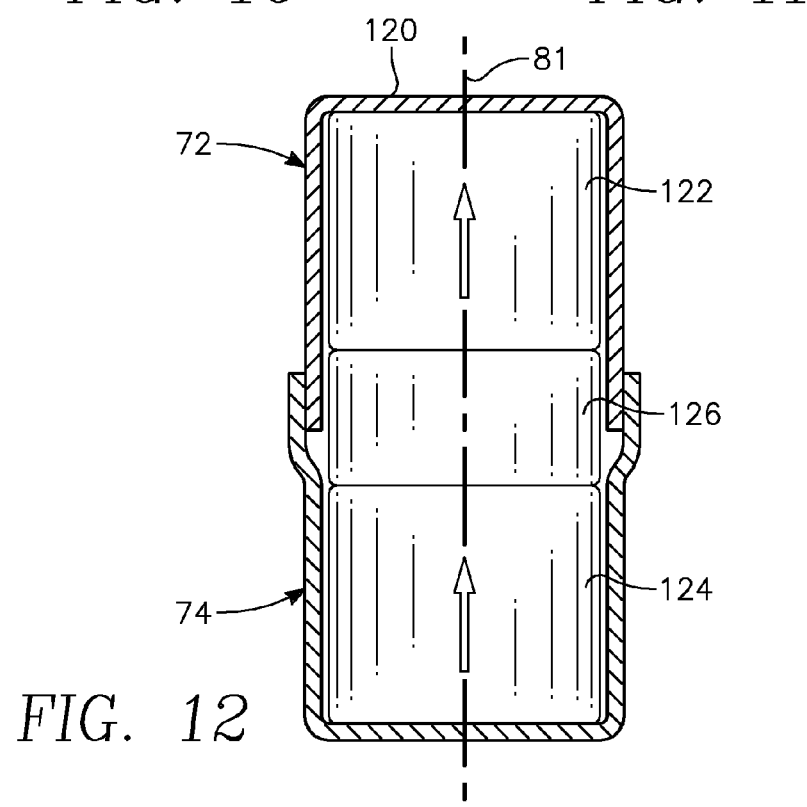
FIG. 12 is a cross-sectional view illustrating the encapsulation of multiple members in one canister.

The canister may contain and encapsulate more than one magnet or other protected member. As illustrated in the cross-sectional view of FIG. 12, a canister 120 may contain two magnets 122, 124 spaced along the canister central axis 81 and separated by an optional non-magnetic spacer 126. Additional drops of adhesive may be applied between the ends of the members 122, 124, 126 so that a single compression and curing process binds them into a tight composite structure. If the polarities of the two magnets 122, 124 are parallel, the spacer 126 tailors the magnetic field distribution along the sides of the canister 120. If the polarities of the two magnets 122, 124 are anti-parallel, the assembly maybe used as a bucking magnet which strongly projects magnetic filed perpendicular to the axis of the canister 120. This and other canisters of the invention may contain other combinations of multiple magnetic or non-magnetic members.

The structures described above all have a simple, generally right circularly cylindrical shape, but the invention is not so limited. Magnets can be fabricated in non-circular shapes, and the cans can be drawn to similar shapes, for example, having generally rectangular cross-sections with rounded corners. One magnet of commercial importance having a shape other than a simple right circular cylinder is an annular, tubular, or toroidal magnet 130 illustrated in exploded orthographic view in FIG. 13. It extends along and is circularly symmetric about an axis and has an cylindrical inner surface surrounding a central bore 132 and a cylindrical outer surface of a larger diameter. Two end faces 134 are generally planar and extend perpendicularly to the axis. A toroidal magnet may be used to process inside the bore in the presence of a substantially constant axial magnetic field. A toroidal magnet may also be used in the SIP+ sputter reactor described by Gopalraja et al. in U.S. Pat. No. 6,451,177 and by Subramani et al. in U.S. Pat. No. 6,406,599, both incorporated herein by reference in their entireties. The reactor includes a target with an annular vault facing the wafer. A toroidal magnet may be placed within the well radially inside the inner side wall of the annular vault to promote sputtering of that side wall. The toroidal magnet is placed within the cooling water bath at the back side of the target and the central bore is used to circulate the cooling water to the planar portion of the target at the bottom of the well.

Such a tubular magnet 130 can advantageously be encapsulated in a toriodal shell of the invention. The shells includes a trough-shaped top can 136 having a tubular inner wall 138 and a larger tubular outer wall 140 joined through an annular roof unillustrated in this view in which the orientation of the can 136 is tilted with respect to the illustrated magnet 130. The two can walls 138, 140 and the washer-shaped roof form an annular trough 142, which is sized to snugly fit the tubular magnet 130 with the magnet end face 134 in contact with the can roof. A bottom can 144 has a lower portion with the same shape as the top can 136 but with a shorter length. However, its outer wall 146 is connected at its upper end to an annular outer lip 148 of sufficiently larger diameter to fit the outside of the outer wall 140 of the top can 136. Similarly, its inner wall 150, which corresponds to the top can inner wall 138, is connected at its upper end to an annular inner lip 152 of sufficiently smaller diameter to fit the inside of the inner wall 138 of the top can 136. The overall lengths of the two cans 136, 144 are prefembly equal.

In an alternate structure, the outer lip 148 is placed on one can 144 and the inner lip 152 is placed on the other can 136. A toroidal canister can be also formed by adapting the cylindrical structures of FIGS. 10 and 11 to a toroidal geometry.

Figures 13, 14:
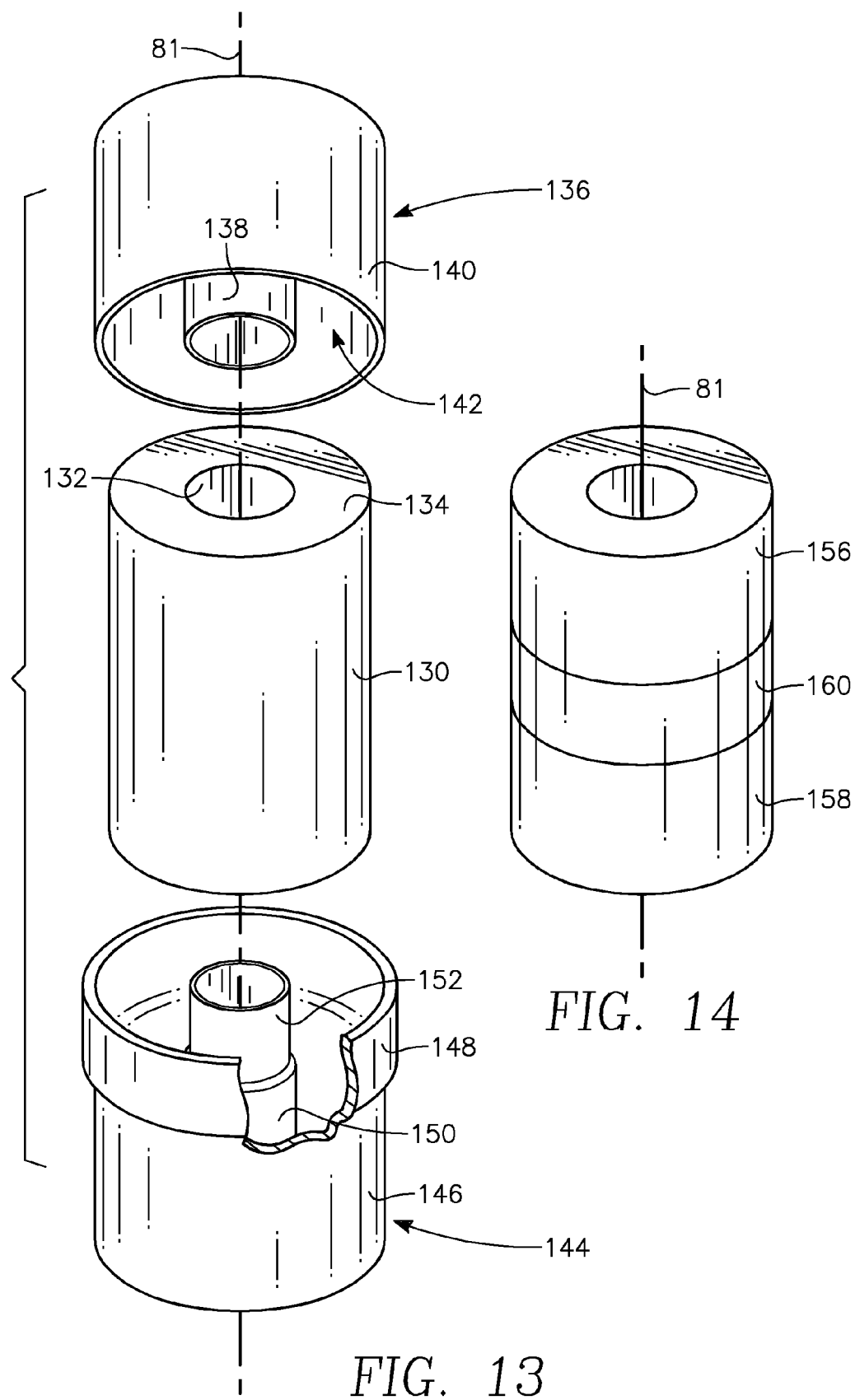
FIG. 13 is an orthographic view of the parts of an encapsulated toroidal magnet.
FIG. 14 is an orthographic view of a stack of toroidal members to be encapsulated in one canister.

The assembly of the parts of FIG. 13 to form a toroidal encapsulated magnet closely follows the previously described assembly of the right circular cylindrical structures of FIGS. 4, 5, and 7. The flowable and curable adhesive is applied over the length of the annular faces 134 of the magnet 130 before its ends are inserted into the respective trough-shaped cans 136, 144 with sufficient force to overlap the two cans 136, 144 in the two annular regions of the two lips 148, 152 and to expel air bubbles by squeezing the adhesive to the exterior of the cans 136, 144.

The central toroidal magnetic assembly of the SIP+ reactor includes, as illustrated in the orthographic view of FIG. 14, two parallel polarized toroidal magnets 156, 158 separated by a non-magnetic toroidal spacer 160. These stacked members 156, 158, 160 can similarly be encapsulated in the toroidal shell of FIG. 13. The non-magnetic spacer 160 provides more uniform sputtering over the inner sidewall of the vault-shaped target.

The encapsulated magnet of the invention is not limited to the uses described above. There are other uses for permanent magnets in semiconductor processing. Plasma sputter reactors are known which place permanent magnets in other locations. Plasma etch reactors sometimes use permanent magnets for shaping the plasma or guiding etching ions. Indeed, the encapsulated magnet of the invention is not limited to semiconductor processing but may advantageously employed in other applications benefitting from a protected and mechanically fixed magnet, for example, in rotary feedthroughs and charged-beam optics.

Depending upon the environment, the shell may be made of materials other than stainless steel, for example, titanium, brass, or even aluminum.

The invention thus provides superior encapsulation of magnets, particularly in harsh environments including cooling baths, but at much reduced cost and increased reliability over encapsulating canisters of the prior art.

The invention claimed is:

1. An encapsulated magnet, comprising: a magnetizable member having a lateral side extending along an axis; a first can having a first sidewall extending along said axis outside of said lateral side and a first end transverse to said axis and integral with said first sidewall; a second can having a second sidewall extending along said axis outside of said lateral side, a second end transverse to said axis and integral with said second sidewall, and a first annular lip extending along said axis, integral with said second sidewall on a side thereof opposite said second end, extending more radially outwardly from the axis than does said second sidewall, surrounding the first sidewall with a clearance between an inner side of the lip and an outer side of the first sidewall of less than 0.2 mm and greater than 0.013 mm, and disposed on a side of said first sidewall opposite said magnetic member; and an adhesive disposed between and binding together (a) said magnetizable member and said first and second sidewalls and (b) said first sidewall and said lip, whereby said magnetic member and said first and second cans are bonded together.

2. The encapsulated magnet of claim 1, wherein said first and second ends have thicknesses of less than 0.64 mm.

3. The encapsulated magnet of claim 2, wherein said first and second sidewalls and said lip have thicknesses of less than 0.64 mm.

4. The encapsulated magnet of claim 1, wherein said magnetizable member and said first and second cans are substantially circularly symmetric about said axis.

5. The encapsulated magnet of claim 4, wherein said magnetizable member is shaped as a right circular cylinder.

6. The encapsulated magnet of claim 4, wherein said magnetizable member is shaped as a torrid and said first and second cans are shaped to have annular troughs.

7. The encapsulated magnet of claim 6:
wherein said first can has a third sidewall parallel to said first sidewall and integral with said first end; and
wherein said second can includes
a fourth sidewall parallel to said second sidewall and integral with said second end, and
a second annular lip parallel to said first annular lip, integral with said fourth sidewall on a side thereof opposite said second end, and disposed on a side of said third sidewall opposite said magnetic member.

8. The encapsulated magnet of claim 1, wherein said cans are formed of non-ferromagnetic stainless steel.

9. The encapsulated magnet of claim 1, wherein said cans are stamped.

10. An encapsulated magnet, comprising: a magnetizable member having a lateral side extending along an axis; a first can comprising a first continuous can member comprising a first sidewall circularly symmetric about and extending along a first axis, having an inner first diameter and an outer second diameter differing therebetween by twice a first wall thickness, and a first end extending transversely to said first axis, having a first end thickness, and connected to said first sidewall; a second can comprising a second continuous can member comprising a second sidewall circularly symmetric about and extending along a second axis disposable along said first axis, having an inner third diameter and an outer fourth diameter differing therebetween by twice a second wall thickness, a second end extending transversely to said second axis and connected to said second sidewall, and a third sidewall circularly symmetric about and extending along said second axis, having an inner fifth diameter larger than said second diameter and separated from the second diameter by a first clearance of less than 0.2 mm and greater than 0.013 mm and an outer sixth diameter greater than said fifth diameter by twice a third wall thickness, and connected to said second sidewall on a side thereof opposite said second end, whereby said third sidewall is slidable over a radial outside of said first sidewall so that said first and second can members are able to partially overlap along said first axis to encapsulate the magnetizable member.

11. The encapsulated magnet of claim 10, wherein said first and third diameters are substantially equal and said second and fourth diameters are substantially equal.

12. The encapsulated magnet of claim 10, wherein said end thicknesses are less than 0.64 mm.

13. The encapsulated magnet of claim 12, wherein said end thicknesses are less than 0.38 mm.

14. The encapsulated magnet of claim 13, wherein said first, second, and third wall thicknesses are less than 0.64 mm.

15. The encapsulated magnet of claim 10, wherein said first and second can members comprise non-magnetic stainless steel.

16. The encapsulated magnet of claim 10, wherein said can members comprise non-ferromagnetic stainless steel.

17. The encapsulated magnet of claim 10, wherein said first and second can members are stamped.

18. A method of encapsulating a first magnetizable member having sides extending along an axis and two member ends extending transversely to said axis, comprising the steps of:
providing a first integrally formed can member comprising (1) at least a first sidewall extending along said axis and having an interior surface accommodating said first member and (2) a first can end extending transversely to said axis;
providing a second integrally formed can member having at least a second sidewall extending along said axis and having an interior surface accommodating said first member, (2) a second can end extending transversely to said axis, (3) a third sidewall extending along said axis more radially outwardly from said axis greater than does said second sidewall, and having an interior surface accommodating said first sidewall with a clearance therebetween of less than 0.2 mm and greater than 0.013 mm;
applying a flowable and curable adhesive to said member ends and inserting said member ends into respective ones of said first and second can members;
overlapping said first and third sidewalls; and
pressing said two can members together along said axis to encapsulate the magnetizable member.

19. The method of claim 18, wherein said overlapping and pressing steps cause said adhesive to flow between said first member and said first and second sidewalls and to flow between said first and third sidewalls.

20. The method of claim 19, wherein said overlapping and pressing steps cause said adhesive to flow to an exterior of said overlapped first and second sidewalls.

21. The method of claim 18, wherein said providing steps include drawing respective blank portions and wherein wall thicknesses of end walls of said first and second can members are less than 0.64 mm.

22. The method of claim 21, wherein said wall thicknesses of said first and second sidewalls are less than 0.64 mm.

23. In a plasma processing reactor including a vacuum pump and means to excite a gas into a plasma to process a substrate supported within said reactor,
THE IMPROVEMENT COMPRISING
a plurality of encapsulated magnets operatively associated with said plasma processing reactor and comprising respective ones of:
a rod magnet extending along an axis;
a first integrally formed can member formed of a non-magnetic stainless steel and comprising (1) at least a first sidewall extending along said axis and having an interior surface inside of which is disposed said rod magnet and (2) a first can end extending transversely to said axis;
a second integrally formed can member formed of said non-magnetic stainless steel and comprising (1) a second sidewall extending along said axis and having an interior surface inside of which is disposed said rod magnet, (2) a second cam end extending transversely to said axis, (3) a third sidewall extending along said axis more radially outwardly than does said second sidewall, and having an interior surface accommodating said first sidewall, wherein a radius of an interior of said third sidewall is larger than a radius of an exterior of said first sidewall by less than 0.2 mm and greater than 0.013 mm;
an adhesive bonding said rod magnet to said first and second sidewalls and bonding said first and third sidewalls together.

24. The plasma processing reactor of claim 23, wherein said first and second can members are drawn from said non-magnetic stainless steel.

25. The plasma processing reactor of claim 23, wherein said first and second can ends and said first, second, and third sidewalls have wall thicknesses of less than 0.64 mm.

* * * * *